US012677548B2

(12) United States Patent
Zhao

(10) Patent No.: US 12,677,548 B2
(45) Date of Patent: Jul. 7, 2026

(54) DISPLAY PANEL COMPRISING REPAIR TRANSISTOR AND REPAIR ELECTRODE AND DISPLAY DEVICE THEREOF

(71) Applicant: Shenzhen China Star Optoelectronics Semiconductor Display Technology Co., Ltd., Shenzhen (CN)

(72) Inventor: Suixin Zhao, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 1228 days.

(21) Appl. No.: 17/622,837

(22) PCT Filed: Dec. 10, 2021

(86) PCT No.: PCT/CN2021/137013
§ 371 (c)(1),
(2) Date: Jun. 1, 2023

(87) PCT Pub. No.: WO2023/092689
PCT Pub. Date: Jun. 1, 2023

(65) Prior Publication Data
US 2024/0040865 A1      Feb. 1, 2024

(30) Foreign Application Priority Data
Nov. 29, 2021    (CN) .......................... 202111435888.8

(51) Int. Cl.
*H10K 59/131*          (2023.01)
(52) U.S. Cl.
CPC ................................. *H10K 59/131* (2023.02)

(58) Field of Classification Search
None
See application file for complete search history.

(56) References Cited

U.S. PATENT DOCUMENTS

2006/0170635 A1*   8/2006   Umezaki ..............   G09G 3/3258
                                                    345/92
2008/0024691 A1    1/2008   Okabe et al.
2010/0207106 A1    8/2010   Lhee et al.
2020/0159287 A1*   5/2020   Jeong ....................   G06F 1/1656

FOREIGN PATENT DOCUMENTS

| CN | 205355054 | 6/2016 |
|----|-----------|--------|
| CN | 105845085 | 8/2016 |
| CN | 107221287 | 9/2017 |
| CN | 110459578 | 11/2019 |
| CN | 111145684 | 5/2020 |
| CN | 111180499 | 5/2020 |
| CN | 111223450 | 6/2020 |

* cited by examiner

*Primary Examiner* — Daniel Whalen

(57) ABSTRACT

The present application discloses a display panel and a display device. The display panel includes a substrate, a driving circuit layer, and a light-emitting structure layer, wherein a drain of a repair transistor is connected to an anode of the light-emitting device, and a source of the repair transistor is connected to a cathode of the light-emitting device, so that when the light-emitting device has an abnormal bright spot, the repair electrode can connect a gate of the repair transistor to a power signal line, and can short-circuit the anode and the cathode of the light-emitting device, so as to facilitate repairing the abnormal bright spot in the light-emitting device as a dark spot.

18 Claims, 5 Drawing Sheets

DISPLAY PANEL COMPRISING REPAIR TRANSISTOR AND REPAIR ELECTRODE AND DISPLAY DEVICE THEREOF

RELATED APPLICATIONS

This application is a National Phase of PCT Patent Application No. PCT/CN2021/137013 having International filing date of Dec. 10, 2021, which claims the benefit of priority of Chinese Patent Application No. 202111435888.8 filed on Nov. 29, 2021. The contents of the above applications are all incorporated by reference as if fully set forth herein in their entirety.

FIELD AND BACKGROUND OF THE INVENTION

The present application relates to a field of display technology, in particular to a display panel and a display device.

An organic light-emitting diode (OLED) display panel adopts self-luminous display technology and does not need any backlight at all. Brightness of an OLED depends on a current flowing therethrough. To turn on or turn off the OLED, or to control the current flowing through the OLED, a pixel circuit with thin film transistors is required.

In the pixel circuit shown in FIG. 1, in a writing stage, a scan signal SCAN controls a transistor T2 to be in an on-state, and a data signal DATA is written into a capacitor C1; in a light-emitting stage, a capacitor C1 supplies power to a gate of a transistor T1 to control a current value of a loop constituted by a power signal VDD and a power signal VSS, and the light-emitting device D1 is driven with the current value of the loop to be in a light-emitting state corresponding to the brightness.

However, in the process of manufacturing the pixel circuit, the stability of the machine and foreign matters in the production line easily affect and cause the anode of the light-emitting device to be directly short-circuited to the power signal VDD, as shown in FIG. 2. At this time, no matter the pixel circuit is in writing stage or the light-emitting stage, the light-emitting device D1 is in a constant light state, and the display panel will form bright spots during display, which seriously affects the display quality.

It should be noted that the above introduction of the background art is only to facilitate a clear and complete understanding of the technical solutions of the present application. Therefore, it cannot be considered that the above-mentioned technical solutions involved are known to those skilled in the art just because it appears in the background of the present application.

SUMMARY OF THE INVENTION

The present application provides a display panel and a display device, so as to solve the technical problem by repairing the abnormal bright spot in the light-emitting device as a dark spot.

In a first aspect, the present application provides a display panel, which includes a substrate; and a drive circuit layer and a light-emitting structure layer disposed on the substrate, wherein the drive circuit layer includes a driving transistor, a repair transistor, a power signal line, and a repair electrode; an anode of the light-emitting structure layer is respectively connected to a source of the driving transistor and a drain of the repair transistor, a cathode of the light-emitting structure layer is connected to a source of the repair transistor, a drain of the driving transistor is connected to the power signal line, and a gate of the repair transistor is connected to the repair electrode; and the repair electrode is configured to connect the gate of the repair transistor to the power signal line in response to a defect of a bright spot in a repaired display panel.

In some of these embodiments, the repair electrode and the power signal line have an overlapping area.

In some of these embodiments, the gate of the repair transistor and the repair electrode are disposed in a gate layer of the drive circuit layer; the drive circuit layer includes a first metal, the power signal line is disposed in the first metal layer, the first metal layer includes a first metal block, and the repair electrode and the first metal block have an overlapping area.

In some of these embodiments, the display panel further includes a second insulating layer, and the second insulating layer is disposed between the gate layer and the first metal block; and wherein in response to an abnormal bright spot in a light-emitting device, the repair electrode is laser soldered with the first metal block to electrically connect the repair electrode to the first metal block.

In some of these embodiments, the display panel further includes: a second insulating layer, and the second insulating layer is disposed between the gate layer and the first metal block; and wherein the repair electrode is electrically connected to the first metal block.

In some of these embodiments, the drive circuit layer includes an active layer, and the active layer includes a drain connection area of the driving transistor and a source connection area of the driving transistor, a drain connection area of the repair transistor, a channel area of the repair transistor, and a source connection area of the repair transistor; and wherein the first metal layer further includes a source of the repair transistor, a drain of the repair transistor, the source of the driving transistor, and the drain of the driving transistor.

In some of these embodiments, the display panel further includes a second metal layer disposed between the substrate and the active layer, and the power signal line further includes a second metal block on the second metal layer.

In some of these embodiments, the display panel further includes a first via hole, wherein the first metal block is electrically connected to the second metal block through the first via hole; a second via hole, wherein the source of the repair transistor is electrically connected to the source connection area of the repair transistor through the second via hole; and a third via hole, wherein the source of the repair transistor is electrically connected to a cathode of the light-emitting device through the third via hole.

In some of these embodiments, the display panel further includes: a fourth via hole, wherein the drain of the repair transistor is electrically connected to the drain connection area of the repair transistor through the fourth via hole; a fifth via hole, wherein the source of the driving transistor is electrically connected to the source connection area of the driving transistor through the fifth via hole; a sixth via hole, wherein the drain of the driving transistor is electrically connected to the drain connection area of the driving transistor through the sixth via hole; and a seventh via hole, wherein the source of the driving transistor is electrically connected to the anode of the light-emitting device through the seventh via hole.

In a second aspect, the present application provides a display device, the display device includes the display panel in any one of the above embodiments, and the display panel is a flexible display panel.

In the display panel and display device provided by the present application, by configuring a repair transistor and a repair electrode, wherein a drain of a repair transistor is electrically connected to an anode of the light-emitting device, a source of the repair transistor is electrically connected to a cathode of the light-emitting device, and the repair electrode is electrically connected to a power signal line, so that when the light-emitting device has an abnormal bright spot, the repair electrode can connect a gate of the repair transistor to the power signal line, so as to short-circuit the anode and the cathode of the light-emitting device, thereby facilitating repairing the abnormal bright spot in the light-emitting device as a dark spot.

BRIEF DESCRIPTION OF THE SEVERAL VIEWS OF THE DRAWINGS

The following detailed description of the specific implementations of the present application in conjunction with the accompanying drawings will make the technical solutions and other beneficial effects of the present application obvious.

DESCRIPTION OF SPECIFIC EMBODIMENTS OF THE INVENTION

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

Figure 1:
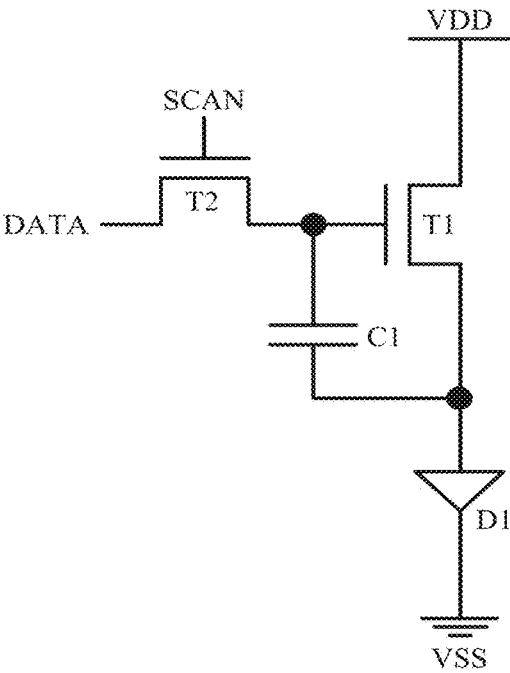
FIG. 1 is a circuit schematic diagram of normal operation of a pixel circuit in the traditional technical solution.
Figure 2:
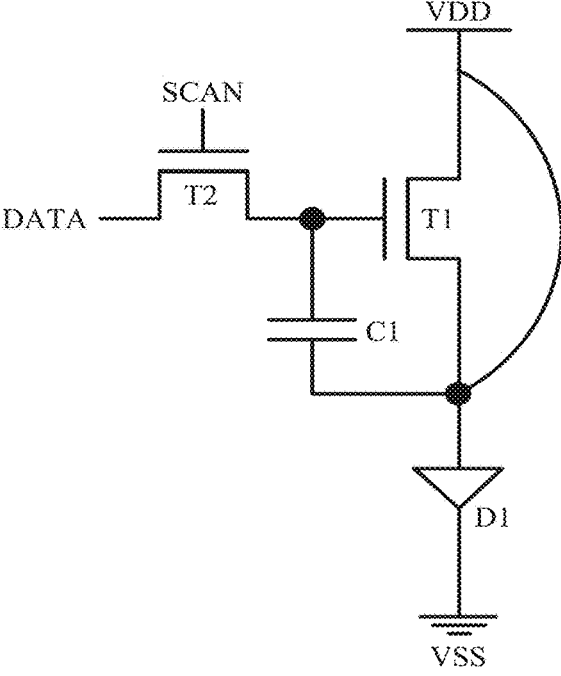
FIG. 2 is a circuit schematic diagram of abnormal operation of the pixel circuit in the traditional technical solution.
Figure 3:
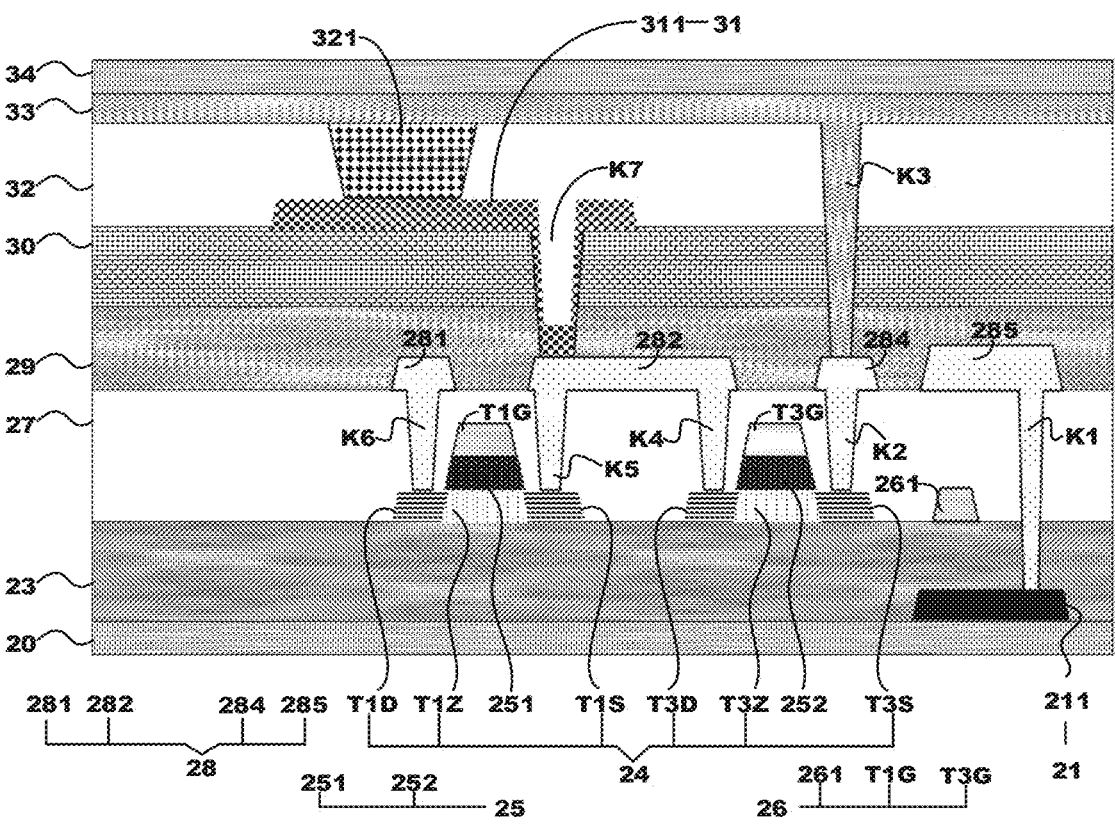
FIG. 3 is a schematic structural diagram of a display panel before repair according to an embodiment of the present application.

In view of abnormal operation of a pixel circuit shown in FIG. 2, this embodiment provides a display panel including a substrate, a driving circuit layer, and a light-emitting structure layer. The driving circuit layer includes a driving transistor, a repair transistor, a power signal line, and a repair electrode. An anode of the light-emitting structure layer is connected to a source of the driving transistor and the drain of the repair transistor, respectively. A cathode of the light-emitting structure layer is connected to a source of the repair transistor. A drain of the repair transistor is connected to the power signal line, and a gate of the repair transistor is connected to the repair electrode. The repair electrode is configured to connect the gate of the repair transistor to the power signal line in response to a defect of a bright spot in a repaired display panel. The power signal line is configured to transmit the power positive signal.

Specifically, in this embodiment, referring to FIGS. 3 to 7, the substrate is a glass substrate 20. The driving circuit layer includes an active layer 24, a gate layer 26, and a first metal layer 28. A second metal layer 21 and a first inorganic insulating layer 23 are further disposed between the substrate and the driving circuit layer. A gate insulating layer 25 is disposed between the active layer 24 and the gate layer 26, and a second inorganic insulating layer 27 is disposed between the gate layer 26 and the first metal layer 28. The light-emitting structure layer includes an anode layer 31, a pixel definition layer 32, an organic light-emitting material layer 321, and a cathode layer 33. A third inorganic insulating layer 29 is disposed between the driving circuit layer and the light-emitting structure layer. The display panel further includes an encapsulation layer 34.

Specifically, in this embodiment, the glass substrate 20, the first inorganic insulating layer 23, the active layer 24, the gate insulating layer 25, the gate layer 26, the second inorganic insulating layer 27, the first metal layer 28, the third inorganic insulating layer 29, the first organic layer 30, the anode layer 31, the pixel defining layer 32, the cathode layer 33, and the encapsulation layer 34 are sequentially stacked from bottom to top.

The active layer 24 may include a drain connection area T1D of the driving transistor, a channel area T1Z of the driving transistor, a source connection area T1S of the driving transistor, a drain connection area T3D of the repair transistor, a channel area T3Z of the repair transistor, a channel area T3Z of the repair transistor, and a source connection area T3S of the repair transistor.

The gate insulating layer 25 may include a first insulating block 251 and a second insulating block 252.

The gate layer 26 may include a gate T1G of the driving transistor, a gate T3G of the repair transistor, and a repair electrode 261. The first insulating block 251 is located between the gate T1G of the driving transistor and the channel area T1Z of the driving transistor. The second insulating block 252 is located between the gate T3G of the repair transistor and the channel area T3Z of the repair transistor, and the repair electrode 261 is connected to the gate T3G of the repair transistor.

The power signal line includes a first metal block 285 located on the first metal layer 28, and the first metal block 285 is connected to the drain 281 of the driving transistor. An orthographic projection of the first metal block 285 on the glass substrate 20 and an orthographic projection of the repair electrode 261 on the glass substrate 20 at least partially overlap each other.

The first metal layer 28 also includes a source 284 of the repair transistor, a drain 282 of the repair transistor, a source 282 of the driving transistor, and a drain 281 of the driving transistor.

The light-emitting structure layer includes a plurality of light-emitting devices D1. The anode layer 31 may include the anode 311 of the light-emitting device. The cathode layer 33 is a blanket conductive layer, which can be used as a cathode of the light-emitting device. The cathode layer 33 is configured to transmit a negative power signal VSS.

In one embodiment, the repair electrode 261 is electrically connected to the gate T3G of the repair transistor, the source 282 of the driving transistor is electrically connected to the drain 282 of the repair transistor, and the orthographic projection of the repair electrode 261 on the glass substrate 20 and the orthographic projection of the power signal line on the glass substrate 20 at least partially overlap. The anode 311 of the light-emitting device is electrically connected to the drain 282 of the repair transistor, and the cathode of the light-emitting device is electrically connected to the source 284 of the repair transistor.

It is appreciated that, in the display panel provided by this embodiment, by configuring the repair transistor and the repair electrode 261, wherein the drain 282 of the repair transistor is electrically connected to the anode 311 of the light-emitting device, the source 284 of the repair transistor is electrically connected to the cathode of the light-emitting device, and the repair electrode 261 is electrically connected to the power signal line T3G, when the light-emitting device has an abnormal bright spot, since the repair electrode 261 and the power signal line at least partially overlap each other, the repair electrode 261 and the power signal line can be soldered without impacting a surrounding structure, so as to short-circuit the anode and the cathode of the light-emitting device, thereby facilitating repairing the abnormal bright spot in the light-emitting device as a dark spot.

The display panel further includes a second metal layer 21, the power signal line further includes a second metal block 211 located on the second metal layer 21, the display panel further includes a first via hole K1, the first via hole K1 penetrates the first inorganic insulating layer 23 and the second inorganic insulating layer 27, and the first metal block 285 is electrically connected to the second metal block 211 through the first via hole K1 to transmit the positive power signal VDD.

In one embodiment, the display panel further includes a second via hole K2 and a third via hole K3. The second via hole K2 penetrates the second inorganic insulating layer 27, and the third via hole K3 penetrates the third inorganic insulating layer 29, the first organic layer 30, and the pixel definition layer 32. The source 284 of the repair transistor is electrically connected to the source connection area T3S of the repair transistor through the second via hole K2; and the source 284 of the repair transistor is electrically connected to the cathode layer 33 through the third via hole K3.

In one embodiment, the display panel further includes a fourth via hole K4, a fifth via hole K5, a sixth via hole K6, and a seventh via hole K7; each of the fourth via hole K4, the fifth via hole K5, and the sixth via hole K6 penetrates the second inorganic insulating layer 27; the seventh via hole K7 penetrates the third inorganic insulating layer 29 and the first organic layer 30; the drain 282 of the repair transistor is electrically connected to the drain connection area T3D of the repair transistor through the fourth via hole K4; the source 282 of the driving transistor is electrically connected to the source connection area T1S of the driving transistor through the fifth via hole K5; the drain 282 of the repair transistor is connected to the source 282 of the driving transistor; the drain 281 of the driving transistor is electrically connected to the drain connection area T1D of the driving transistor through the sixth via hole K6; the drain 281 of the driving transistor is also connected to the power signal line (not shown in the cross-sectional view of FIG. 3); the source 282 of the driving transistor is electrically connected to the anode 311 of the light-emitting device through the seventh via hole K7.

Figure 4:
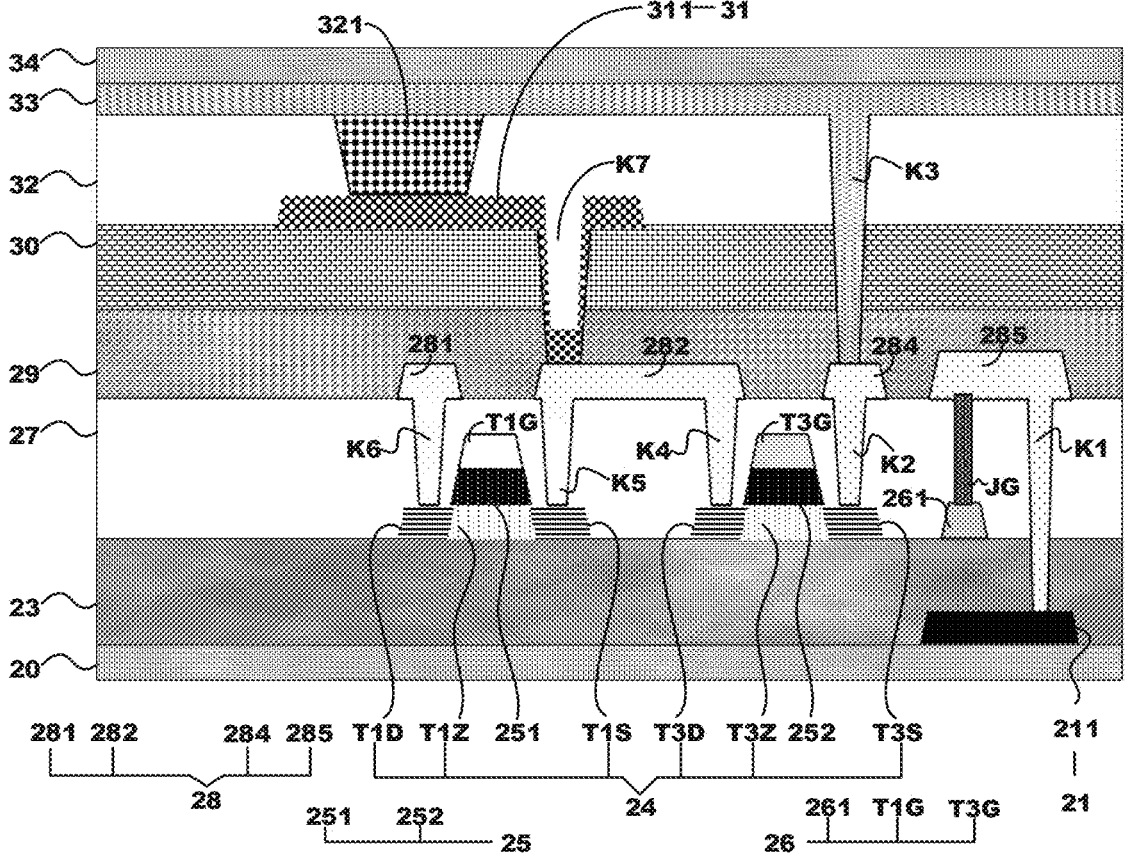
FIG. 4 is a schematic structural diagram of a display panel after repair according to an embodiment of the present application.

As shown in FIG. 4, in one embodiment, in response to an abnormal bright spot in a light-emitting device, the repair electrode 261 is laser soldered with the power signal line to electrically connect the repair electrode 261 to the gate T3G of the repair transistor.

Alternatively, if the drain 281 of the driving transistor is directly electrically connected to the source 282 of the driving transistor, the repair electrode 261 is laser soldered with the power signal line to electrically connect the repair electrode 261 to the gate T3G of the repair transistor.

In summary, after soldering is performed in or around an area JG by the repair method in the above embodiment, the repair electrode 261 is electrically connected to the power signal line. In this case, the repair transistor is turned on, and the anode 311 and the cathode of the light-emitting device are short-circuited to each other. Since voltages at opposite ends of the light-emitting device are almost equal, the light-emitting device cannot be lit, and the light-emitting device is repaired as a dark spot.

Figure 5:
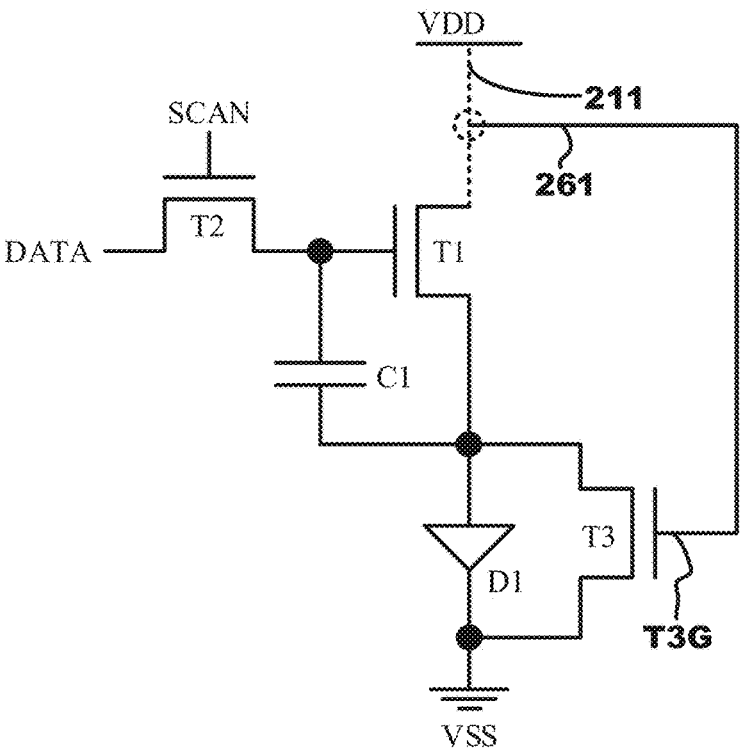
FIG. 5 is an equivalent circuit diagram of the display panel shown in FIG. 3.

It should be noted that the display panel in the above-mentioned embodiment can construct a plurality of pixel circuits as shown in FIG. 5. In the pixel circuits, the positive power supply signal VDD can sequentially pass through the second metal block 211, the first metal block 285, and the repair electrode to the gate T3G of the repair transistor T3, wherein one end of the repair transistor T3 is electrically connected to the anode electrode of the light emitting device D1, another end of the repair transistor T3 is electrically connected to the cathode of the light emitting device D1, and the gate T3G of the repair transistor T3 is electrically connected to the repair electrode 261. However, as shown by a dashed frame in FIG. 5, the repair electrode 261 only overlaps the first power line but is not electrically connected to the first power line before repair.

It should be noted that during the process of manufacturing the pixel circuit, the reasons that cause the light-emitting device D1 to be in a constant light state are complex and diverse, and usually need to be analyzed and then repaired. This process may damage the pixel circuit or the display panel, and take quite a long time and large manpower and/or machine resources. However, the pixel circuit provided by this embodiment can quickly and accurately complete the repair process of each bright spot when the light-emitting device D1 is in a constant light state, and change the bright spot into a dark spot, thereby improving the display quality.

It should be noted that the light-emitting device D1 may be, but not limited to, an organic light-emitting semiconductor (OLED), a Micro-LED, or a Mini-LED.

In the pixel circuits, the drain of the repair transistor T3 is electrically connected to the anode of the light-emitting device D1, and the source of the repair transistor T3 is electrically connected to the cathode of the light-emitting device D1. One end of a storage capacitor C1 is electrically connected to the gate of the driving transistor T1, and another end of the storage capacitor C1 is electrically connected to the source of the driving transistor T1. A drain of a switching transistor T2 is configured to connect to the data signal DATA, the gate of the switching transistor T2 is configured to connect to the scan signal SCAN, and the source of the switching transistor T2 is electrically connected to the gate of the driving transistor T1. The cathode of the light-emitting device D1 is connected to the negative power supply signal VSS.

In one embodiment, the repair transistor T3 may be an oxide thin film transistor or a polysilicon thin film transistor.

In one embodiment, at least one of the repair transistor T3, the driving transistor T1, and the switching transistor T2 may be a metal oxide thin film transistor or a low temperature polysilicon thin film transistor.

Figure 6:
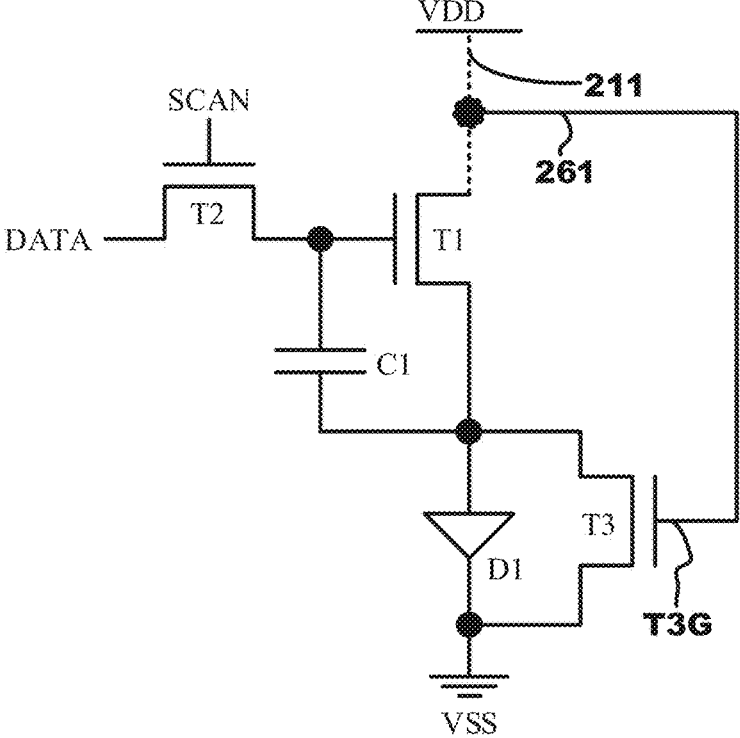
FIG. 6 is an equivalent circuit diagram of the display panel shown in FIG. 4.

As shown in FIG. 6, a difference from FIG. 5 is that after a corresponding pixel circuit is repaired in the foregoing embodiment, the repair electrode 261 is electrically connected to the power signal line.

Figure 7:
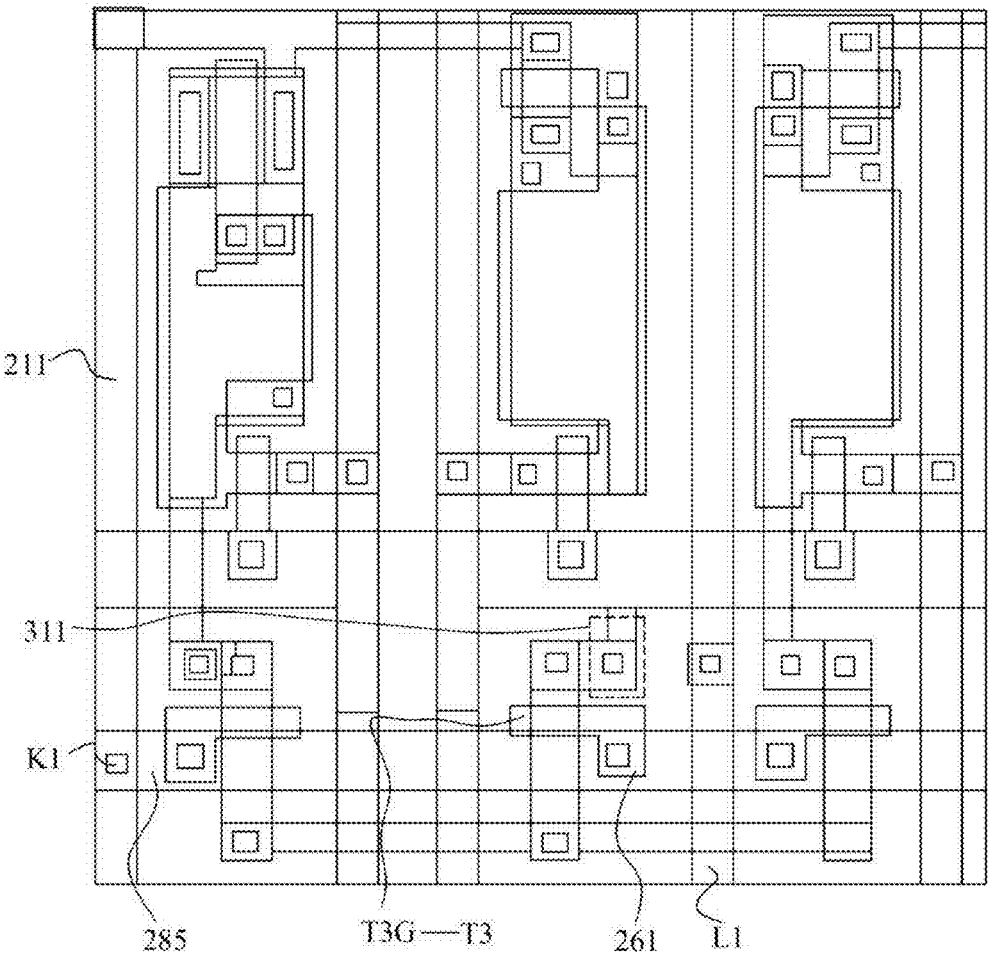
FIG. 7 is a top view of a structure of the display panel shown in FIG. 3.

In the display panel shown in FIG. 7, the second metal block 211 extends in a vertical direction. The first metal block 285 is electrically connected to the second metal block 211 through the first via hole K1. The repair electrode 261 may be integrally formed with the gate T3G of the repair transistor T3 and extend in a horizontal direction. An orthographic projection of the first metal block 285 on the glass substrate and an orthographic projection of the repair electrode 261 on the glass substrate at least partially overlap each other. The drain of the repair transistor T3 is electrically connected to the anode 311 of the light-emitting device. The source of the repair transistor T3 is electrically connected to the wiring L1, wiring L1 is electrically connected to the cathode of the light-emitting device, and the wiring L1 is configured to transmit a negative power signal.

In one embodiment, the power signal line configured to transmit the power positive signal is usually blanketly formed, and can provide the same power positive signal for each pixel circuit. When the light-emitting device in a certain pixel circuit is in a constant light state, if the cutting technology is used to cut and repair the blanket power signal line, it will easily cause an adjacent pixel circuit to form a dark spot, and even cause a row of the pixel circuits to form dark spots. In this case, it will cause the display panel to form a dark line; and if the technical solution of soldering or laser soldering is used to repair the pixel circuit of this embodiment, the corresponding pixel circuit can be repaired accurately and expressly without accidentally damaging other pixel circuits.

In one embodiment, this embodiment provides a display device, which includes the display panel in any of the above-mentioned embodiments, and the display panel is a flexible display panel.

It is appreciated that, in the display device provided in this embodiment, by configuring a drain of a repair transistor to electrically connect to an anode of the light-emitting device, a source of the repair transistor to electrically connect to a cathode of the light-emitting device, when the light-emitting device has an abnormal bright spot, an orthographic projection of the repair electrode on the glass substrate and an orthographic projection of the power signal line on the glass substrate at least partially overlap each other, so that the repair electrode 261 and the power signal line can be soldered without impacting a surrounding structure, so as to short-circuit the anode and the cathode of the light-emitting device, thereby facilitating repairing the abnormal bright spot in the light-emitting device as a dark spot.

In the above embodiments, the descriptions of each embodiment have their own emphasis. The parts that are not described in detail in an embodiment can be referred to the detailed descriptions in other embodiments above, which will not be repeated herein for brevity.

The display panel and the display device provided by the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

8

What is claimed is:

1. A display panel comprising a repair transistor and a repair electrode, wherein the display panel comprises:

a substrate; and a drive circuit layer and a light-emitting structure layer disposed on the substrate, wherein the drive circuit layer comprises a driving transistor, the repair transistor, a power signal line, and the repair electrode;

an anode of the light-emitting structure layer is respectively connected to a source of the driving transistor and a drain of the repair transistor, a cathode of the light-emitting structure layer is connected to a source of the repair transistor, a drain of the driving transistor is connected to the power signal line, and a gate of the repair transistor is connected to the repair electrode; and the repair electrode is configured to connect the gate of the repair transistor to the power signal line in response to a defect of a bright spot in a repaired display panel;

wherein the repair electrode and the power signal line have an overlapping area.

2. The display panel comprising the repair transistor and the repair electrode according to claim 1, wherein the gate of the repair transistor and the repair electrode are disposed in a gate layer of the drive circuit layer; the drive circuit layer comprises a first metal layer, the power signal line is disposed in the first metal layer, the first metal layer comprises a first metal block, and the repair electrode and the first metal block have an overlapping area.

3. The display panel comprising the repair transistor and the repair electrode according to claim 2, wherein the display panel further comprises a second insulating layer, and the second insulating layer is disposed between the gate layer and the first metal block; and wherein in response to an abnormal bright spot in a light-emitting device, the repair electrode is laser soldered with the first metal block to electrically connect the repair electrode to the first metal block.

4. The display panel comprising the repair transistor and the repair electrode according to claim 3, wherein the drive circuit layer comprises an active layer, and the active layer comprises a drain connection area of the driving transistor and a source connection area of the driving transistor, a drain connection area of the repair transistor, a channel area of the repair transistor, and a source connection area of the repair transistor; and wherein the first metal layer further comprises a source of the repair transistor, a drain of the repair transistor, the source of the driving transistor, and the drain of the driving transistor.

5. The display panel comprising the repair transistor and the repair electrode according to claim 4, wherein the display panel further comprises a second metal layer disposed between the substrate and the active layer, and the power signal line further comprises a second metal block on the second metal layer.

6. The display panel comprising the repair transistor and the repair electrode according to claim 5, wherein the display panel further comprises a first via hole, wherein the first metal block is electrically connected to the second metal block through the first via hole;

a second via hole, wherein the source of the repair transistor is electrically connected to the source connection area of the repair transistor through the second via hole; and a third via hole, wherein the source of the repair transistor is electrically connected to a cathode of the light-emitting device through the third via hole.

7. The display panel comprising the repair transistor and the repair electrode according to claim 6, wherein the display panel further comprises:

a fourth via hole, wherein the drain of the repair transistor is electrically connected to the drain connection area of the repair transistor through the fourth via hole;

a fifth via hole, wherein the source of the driving transistor is electrically connected to the source connection area of the driving transistor through the fifth via hole;

a sixth via hole, wherein the drain of the driving transistor is electrically connected to the drain connection area of the driving transistor through the sixth via hole; and a seventh via hole, wherein the source of the driving transistor is electrically connected to the anode of the light-emitting device through the seventh via hole.

8. The display panel comprising the repair transistor and the repair electrode according to claim 2, wherein the display panel further comprises: a second insulating layer, and the second insulating layer is disposed between the gate layer and the first metal block; and wherein the repair electrode is electrically connected to the first metal block.

9. A display device comprising a display panel, the display panel comprising a repair transistor and a repair electrode, wherein the display panel comprises:

a substrate; and a drive circuit layer and a light-emitting structure layer disposed on the substrate, wherein the drive circuit layer comprises a driving transistor, the repair transistor, a power signal line, and the repair electrode;

an anode of the light-emitting structure layer is respectively connected to a source of the driving transistor and a drain of the repair transistor, a cathode of the light-emitting structure layer is connected to a source of the repair transistor, a drain of the driving transistor is connected to the power signal line, and a gate of the repair transistor is connected to the repair electrode; and the repair electrode is configured to connect the gate of the repair transistor to the power signal line in response to a defect of a bright spot in a repaired display panel; and wherein the display panel is a flexible display panel, and the repair electrode and the power signal line have an overlapping area.

10. The display device comprising the repair transistor and the repair electrode according to claim 9, wherein the gate of the repair transistor and the repair electrode are disposed in a gate layer of the drive circuit layer; the drive circuit layer comprises a first metal layer, the power signal line is disposed in the first metal layer, the first metal layer comprises a first metal block, and the repair electrode and the first metal block have an overlapping area.

11. The display device comprising the repair transistor and the repair electrode according to claim 10, wherein the display panel further comprises a second insulating layer, and the second insulating layer is disposed between the gate layer and the first metal block; and wherein in response to an abnormal bright spot in a light-emitting device, the repair electrode is laser soldered with the first metal block to electrically connect the repair electrode to the first metal block.

12. The display device comprising the repair transistor and the repair electrode according to claim 11, wherein the drive circuit layer comprises an active layer, and the active layer comprises a drain connection area of the driving transistor and a source connection area of the driving transistor, a drain connection area of the repair transistor, a channel area of the repair transistor, and a source connection area of the repair transistor; and wherein the first metal layer further comprises a source of the repair transistor, a drain of the repair transistor, the source of the driving transistor, and the drain of the driving transistor.

13. The display device comprising the repair transistor and the repair electrode according to claim 12, wherein the display panel further comprises a second metal layer disposed between the substrate and the active layer, and the power signal line further comprises a second metal block on the second metal layer.

14. The display device comprising the repair transistor and the repair electrode according to claim 13, wherein the display panel further comprises a first via hole, wherein the first metal block is electrically connected to the second metal block through the first via hole;

a second via hole, wherein the source of the repair transistor is electrically connected to the source connection area of the repair transistor through the second via hole; and a third via hole, wherein the source of the repair transistor is electrically connected to a cathode of the light-emitting device through the third via hole.

15. The display device comprising the repair transistor and the repair electrode according to claim 14, wherein the display panel further comprises:

a fourth via hole, wherein the drain of the repair transistor is electrically connected to the drain connection area of the repair transistor through the fourth via hole;

a fifth via hole, wherein the source of the driving transistor is electrically connected to the source connection area of the driving transistor through the fifth via hole;

a sixth via hole, wherein the drain of the driving transistor is electrically connected to the drain connection area of the driving transistor through the sixth via hole; and a seventh via hole, wherein the source of the driving transistor is electrically connected to the anode of the light-emitting device through the seventh via hole.

16. The display device comprising the repair transistor and the repair electrode according to claim 10, wherein the display panel further comprises: a second insulating layer, and the second insulating layer is disposed between the gate layer and the first metal block; and wherein the repair electrode is electrically connected to the first metal block.

17. The display device comprising the repair transistor and the repair electrode according to claim 9, wherein the power signal line is configured to transmit a power positive signal, and the power positive signal is configured to turn on the repair transistor.

18. The display device comprising the repair transistor and the repair electrode according to claim 9, wherein the substrate is a glass substrate.

\* \* \* \* \*